United States Patent [19]

Scranton et al.

[11] 4,084,172

[45] Apr. 11, 1978

[54] HIGHLY ELECTRONEGATIVE $(SN)_x$ CONTACTS TO SEMICONDUCTORS

[75] Inventors: Robert A. Scranton, La Canada; Thomas C. McGill, Pasadena, both of Calif.

[73] Assignee: The United States of America as represented by the Secretary of the Navy, Washington, D.C.

[21] Appl. No.: 805,489

[22] Filed: Jun. 10, 1977

[51] Int. Cl.² .................................... H01L 29/48
[52] U.S. Cl. ........................................ 357/15; 357/2; 357/16; 357/61
[58] Field of Search ................... 357/15, 16, 61, 2, 26

[56] References Cited
PUBLICATIONS

R. Scranton et al., "Highly Electronegative Metallic Contacts to Semiconductors Using Polymeric Sulfur Nitride," Appl. Phys. Lett., vol. 29, No. 1, Jul. 1, 1976, pp. 47–48.

C. Chiang et al., "Effect of Uniaxial Stress on Electrical Conductivity of Sulphur Nitride Polymer," Physics Letters, vol. 60A, No. 4, Mar. 7, 1977, pp. 375–377.

*Primary Examiner*—Joseph E. Clawson, Jr.
*Attorney, Agent, or Firm*—Richard S. Sciascia; Paul N. Critchlow

[57] ABSTRACT

Polymeric sulfur nitride is a conductive metallic compound providing a highly electronegative contact for both n- and p- type semiconductor materials. Tests show the electronegativity to be higher than Au. Larger barriers are obtained for n-type semiconductors and smaller barriers, or Ohmics, for p-types.

7 Claims, 5 Drawing Figures

HIGHLY ELECTRONEGATIVE $(SN)_x$ CONTACTS TO SEMICONDUCTORS

BACKGROUND OF THE INVENTION

The present invention relates to semiconductors and, in particular, to metal contacts formed on semiconductors to improve the barrier energy range.

It is known that a potential barrier forms when a metal and a semiconductor are brought into contact and, further, that the barrier height is dependent upon the electronegativity of the metal (C. A. Mead, Solid State Electron. 9, 1023–1966). When the barrier is small, the contact is said to be 'Ohmic'. When large, ($>>kT$), it is 'rectifying'. Ohmic contacts to p-type wide-bandgap semiconductors require highly electronegative metals, especially if heavy doping is not possible (C. A. Mead, Ohmic Contacts to Semiconductors, edited by B. Schwartz — Electrochem. Soc., NY, 1969, p 6). On a n-type semiconductors barrier height increases with increasing metal electronegativity. Such barriers are useful for transistors and solar cells as well as for materials which cannot easily be made both p-type and n-type - See: Sze, Physics of Semiconductor Devices, Wiley, NY, 1969, pp 410–412, 669; Stirn and Yeh, Appli, Physics Lett. 27, 195, 1975; Haeri and Rhoderick, Proceedings of Conference on Metal Semiconductor Contacts, Manchester — The Instit. of Physics, London, 1974, p 84.

Over 10 years ago, C. A. Mead and co-workers (Solid State Electron, 1966 — supra) demonstrated that on many semiconductors the barrier heights of the common metals can be ranked or ordered by the so-called Peter Pauling electronegativity scale. (Linus & Pauling, Chemistry — Freeman, San Francisco, 1975, p 174.) In the present drawings, FIG. 1 demonstrates this scale applied to a number of representative elements. To the right of the scale are the very electronegative elements which, as stated, produce high barriers to n-type semiconductors. The commonly-used elemental metals such as Al, In, Pt and Au occupy a rather short range of less than 1 or, as shown, a range that extends from 1.5 (Al) to 2.4 (Au). Actually, there are a number of more electropositive metals which produce lower barriers to n-type semiconductors than the commonly-used metals, but, unfortunately, these metals are very reactive.

Of all the elemental metals, Au, the most electronegative metal, produces the highest barrier to n-type semiconductors and, for this reason, gold contacts have been rather commonly used. Nevertheless, in many situations, contacts that are even more electronegative than gold are desired both for the higher barriers to n-type and the ohmics to the p-type semiconductors. However, there are only eight elements more electronegative than Au and not one of the eight is a conductor. To obtain increased electronegativity there is a need to consider compounds rather than the elemental metals. It also is essential that the compound be a metallic conductor and, in this regard, it is to be noted that a number of highly electronegative elements to the right of Au are insulators. For example, both sulfur and nitrogen are very electronegative insulators.

As should be apparent in the foregoing discussion, a principal object of the invention is to produce a more electronegative contact than Au for n-type semiconductors.

Another object is to produce smaller barriers or ohmics to p-type semiconductors.

As will be described, the objects are achieved by the use of a new contact material, polymeric sulfur nitride, $(SN)_x$.

BRIEF DESCRIPTION OF THE DRAWINGS

The invention is illustrated in the accompanying drawings of which.

DETAILED DESCRIPTION OF THE INVENTION

Figure 2:
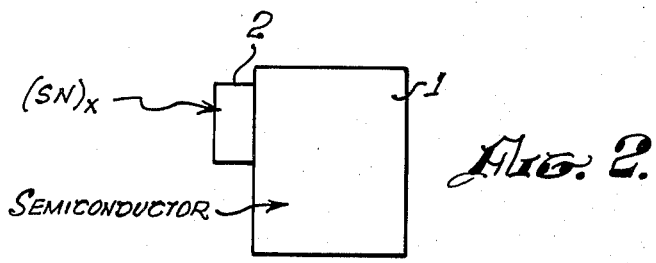
FIG. 2 is a schematic of a barrier formed by contacting a semiconductor substrate and the metal compound of the present invention.

FIG. 2 schematically shows a semiconductor substrate 1 contacted by a metal 2 for the well-known purpose of forming a barrier which may be Ohmic or rectifying depending on whether the semiconductor is n or p type. Metal contact 2 is polymeric sulfur nitride $(SN)_x$. The substrate may be any of the common semiconductor materials compatible for use with the $(SN)_x$. In certain Schottky barrier tests to be described, the semiconductors were ZnS and ZnSe. Other appropriate examples will be set forth in a subsequently-appearing Table I which includes both n and p type materials.

The principal discovery of the invention is the fact that $(SN)_x$ produces smaller barriers or Ohmics to p-type semiconductors as well as significantly larger rectifying barriers on n-type semiconductors. Specifically, $(SN)_x$ produces a barrier energy of about one eV higher than Au on n-type ZnS and, on the p-type semiconductors, the barriers are lower than Au.

Figure 1:
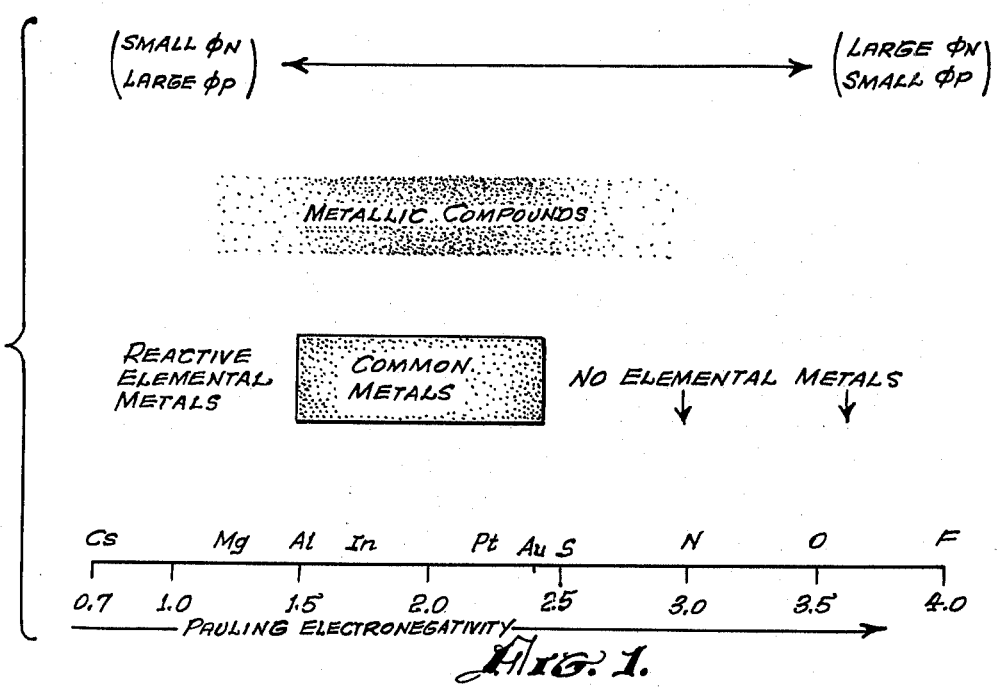
FIG. 1 is a diagram illustrating the so-called Pauling electronegativity scale.

Both sulfur and nitrogen are very electronegative insulators. As shown in the FIG. 1 Pauling electronegativity scale, they are considerably more electronegative than Au. Nevertheless, being insulators, they are not effective contacts for semiconductor use. However, a binary compound of these elements, $(SN)_x$, is a conductor and it also is more electronegative than Au. $(SN)_x$ is composed of long chains of alternating sulfur and nitrogen atoms. It is a gold brown, solid metallic conductor which can be grown as a crystal or deposited as a thin film.

Since the electronegativity of $(SN)_x$ is quite high and since its barrier height on n-type semiconductors is high, it would be expected that $(SN)_x$ also would product smaller barriers to p-type semiconductors. This expectation has been verified by a study of the relative barrier heights of $(SN)_x$ and Au on nine different compound semiconductors. The results of the study which involved about 15,000 measurements are summarized in the following Table I:

Table I

| | Comparison of Au and $(SN)_x$ Schottky Barrier Heights in eV on Semiconductors Cleaved in Air | | | | | | | | |
|---|---|---|---|---|---|---|---|---|---|
| Semiconductor | n-GaAs | p-GaAs | n-InP | p-Gap | p-ZnTe | n-CdSe | n-ZnSe | n-CdS | n-ZnS |
| $\phi(SN)_x - \phi(Au)$ | .1 | −.1 | .3 | −.2 | −.3 | .1 to .2 | .3 to .6 | .3 | .9 to 1.0 |

The data of Table I provides a comparison between barrier heights for Au contacts to air cleaved semiconductors to the barrier heights for $(SN)_x$, i.e. $\phi(SN)_x - \phi(Au)$. By three methods of measurement $(SN)_x$ was shown to produce a more electronegative contact than Au. For the p-type, it produces lower barriers than Au and for n-type the barriers are higher. The improvement is not as great for covalent semiconductors as for ionic ZnS. However, 0.1 to 0.3 eV still is substantial.

Preparation and testing of the metal contacts followed certain procedures which will be described with reference to the production of the $(SN)_x$ contacts on ZnS and ZnSe substrates.

The source $(SN)_x$ was prepared from $S_4N_4$ by vacuum sublimation through silver wool held at 220° C. The resultant $S_2N_2$ was polymerized at room temperature followed by a 2-h treatment at 85° C in high vacuum to remove unreacted $S_2N_2$. Zinc sulfide and zinc selenide crystals were heated in liquid zinc, at 880° and 750° C, respectively, to lower the zinc vacancy concentration. Net doping was n type: $5 \times 10^{16}$ cm$^{-3}$ for ZnS and $5 \times 10^{17}$ cm$^{-3}$ for ZnSe as determined by C-V data. Samples were cleaved on opposite ends and Ohmic contacts were made using a Hg-Cd-In amalgam and heating to 450° C for 30 sec in an inert atmosphere. Contact resistances were typically less than 0.04 $\Omega$cm$^2$ for ZnSe and less than 2 $\Omega$cm$^2$ for ZnS. The Ohmic contacts were tested for linearity and samples were cleaved again between the two contacts to expose two fresh surfaces just prior to placing in a vacuum system. Gold barriers were formed on these fresh surfaces by evaporating gold through a metal screen at about $10^{-6}$ Torr. Polymeric sulfur nitride barriers were deposited using a glass sublimator with the $(SN)_x$ source at 135°–150° C and the sample attached to a water-cooled (15°–20° C) cold finger. The $(SN)_x$ diodes were isolated by scribing under a microscope.

Figure 3:
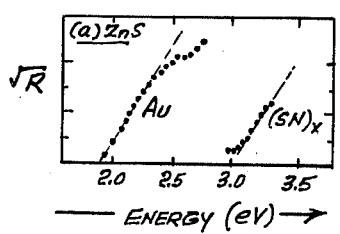
FIGS. 3, 4 and 5 are plots of the comparative barrier energies of Au and $(SN)_x$.
Figure 4:
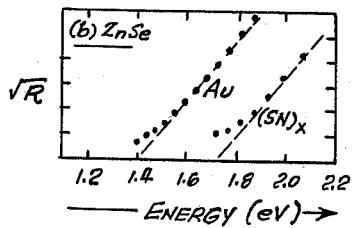

Barriers were measured using photoresponse, current-voltage (I-V) and capacitance-voltage (C-V) methods. Photoresponse measurements are considered most reliable, as experience with metal barriers on various semiconductors has shown this technique to be the least susceptible to details of surface preparation. FIGS. 3 and 4 show the square root of short-circuit photocurrent per incident photon plotted against photon energy for typical $(SN)_x$ barriers on ZnS and ZnSe. For comparison, the photoresponse of Au barriers is also shown. The $(SN)_x$ barrier is about 1 eV higher than Au on ZnS and about 0.3 eV higher than Au on ZnSe.

In the current-voltage measurements, the inverse slope of the logarithm of the forward current versus applied voltage for all diodes was in the range 1.2kT/q to 2.2kT/q. The zero-voltage intercept was obtained by extrapolating with an inverse slope of 1.1kT/q from the steepest portion of the I-V curve, approximately $10^{-8}$–$10^{-5}$ A cm$^{-2}$ for $(SN)_x$ and $10^{-3}$–$10^{-1}$ A cm$^{-2}$ for Au. Extrapolating from the same current density for all samples would increase the $(SN)_x$ barrier energy relative to Au; extrapolating using the actual measured slope would materially decrease the $(SN)_x$ values.

Figure 5:
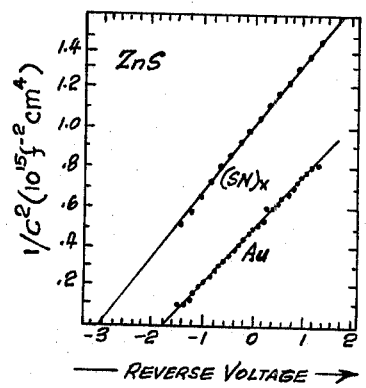

The barrier energies as determined by the capacitance-voltage method for $(SN)_x$/ZnS diodes covered a wide range. This result is consistent with the formation of an interfacial layer. The capacitance voltage plot producing the lowest barrier is shown in FIG. 5. This value of barrier energy agrees with the photoresponse and I-V measurements; the value of the doping concentration obtained from the slope agrees well with the Au/ZnS barrier measurement. All C-V measurements were made in the dark, returning to zero bias in between measurements. The capacitance of the $(SN)_x$/ZnSe diodes varied only slightly with applied voltage, preventing a C-V barrier determination for this structure.

Results of the various measurements are summarized in Table II. The $(SN)_x$ barriers are about 1 eV higher than Au on n-ZnS and about 0.35 eV higher than Au on n-ZnSe. The variation of the barrier energy $\phi$ with metal electronegativity depends on the ionicity of the semiconductor. The slope $S = (d\phi/d_X)$ is 1.0 for ZnS and 0.5 for ZnSe. More recent C-V measurements on chemically etched ZnSe indicates $S \approx 0.7$. Thus, one would expect the barrier difference $\phi[(SN)_x] - \phi[Au]$ to be smaller on ZnSe than on ZnS. The data suggest that $(SN)_x$ may be assigned an effective electronegativity of perhaps 2.9 or more on the Pauling scale, at least 0.5 higher than Au.

TABLE II

| | Comparison of Au and $(SN)_x$ Barrier Energies in eV on ZnS and ZnSe Substrates | | | |
|---|---|---|---|---|
| Metallic layer | Substrate | | | |
| | ZnS | | ZnSe | |
| | Au | $(SN)_x$ | Au | $(SN)_x$ |
| Photoresponse | 1.9 | 2.9–3.0 | 1.3–1.4 | 1.7 |
| I-V | 1.8 | 2.7 | 1.3 | 1.9 |
| C-V | 1.9 | 3.2 (lowest) | 1.6 | — |

Although the $(SN)_x$ barriers of the present invention have obvious utility, it is recognized that some problems involving stability may exist particularly if conventional semiconductor device processing is used. However, the test samples provided reliable data to clearly demonstrate the value of the $(SN)_x$ and it is expected that improved processing techniques will be forthcoming. Also, some of the prepared samples exhibited ageing although this difficulty largely can be avoided by employing a thin film protective covering such as a gold film. In general, the capacity to provide the marked increase in effective electronegativity appears to be a significant improvement which can be used to advantage in a number of applications, such as in transistors and solar cells or for materials which cannot easily be made both p-type and n-type.

Obviously many modifications and variations of the present invention are possible in the light of the above teachings. It is therefore to be understood that within the scope of the appended claims the invention may be practiced otherwise than as specifically described.

We claim:

1. A semiconductor structure comprising:
a semiconductor substrate, and a metallic-like contact material formed on said substrate, said contact material being a polymeric sulfur nitride $(SN)_x$.

2. The structure of claim 1 wherein said substrate is an n-type semiconductor material whereby said contact is rectifying.

3. The structure of claim 2 wherein said substrate is a compound semiconductor material.

4. The structure of claim 3 wherein said compound material is selected from a group consisting of ZnS and ZnSe.

5. The structure of claim 1 wherein said substrate is a p-type semiconductor material.

6. The structure of claim 5 wherein said substrate is a compound semiconductor material.

7. The structure of claim 1 wherein said substrate is a compound ionic semiconductor material.

* * * * *